(12) United States Patent
Okigawa et al.

(10) Patent No.: US 9,143,760 B2
(45) Date of Patent: Sep. 22, 2015

(54) SOLID-STATE IMAGING DEVICE

(71) Applicant: FUJIFILM Corporation, Tokyo (JP)

(72) Inventors: Mitsuru Okigawa, Saitama (JP); Kenkichi Hayashi, Saitama (JP); Seiji Tanaka, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/296,898

(22) Filed: Jun. 5, 2014

(65) Prior Publication Data

US 2014/0285629 A1    Sep. 25, 2014

Related U.S. Application Data

(63) Continuation of application No. PCT/JP2012/083582, filed on Dec. 26, 2012.

(30) Foreign Application Priority Data

Dec. 27, 2011  (JP) ................................. 2011-285902

(51) Int. Cl.
  *H04N 13/02*     (2006.01)
  *H01L 27/146*    (2006.01)
  *H04N 9/04*      (2006.01)

(52) U.S. Cl.
  CPC ...... *H04N 13/0217* (2013.01); *H01L 27/14621* (2013.01); *H04N 9/045* (2013.01); *H04N 13/0207* (2013.01); *H04N 13/0257* (2013.01); *H04N 2209/045* (2013.01)

(58) Field of Classification Search
  None
  See application file for complete search history.

(56) References Cited

U.S. PATENT DOCUMENTS 5,889,554 A      3/1999   Mutze
6,522,356 B1 *   2/2003   Watanabe ..................... 348/272
(Continued)

FOREIGN PATENT DOCUMENTS

EP    1 793 620 A1    6/2007
JP    2-210996 A      8/1990
(Continued)

OTHER PUBLICATIONS

International Search Report for PCT/JP2012/083582 mailed on Feb. 5, 2013.
(Continued)

*Primary Examiner* — Jayanti K Patel
*Assistant Examiner* — Francis G Geroleo
(74) *Attorney, Agent, or Firm* — Birch, Stewart, Kolasch & Birch, LLP

(57)        ABSTRACT

A color filter array has G filters, R filters, and B filters. A pair of phase difference pixels adjoining in a horizontal direction is provided with one of the G, R, and B filters. In the color filter array, a fundamental array pattern, including the G, R, and B filters, is repeatedly disposed in horizontal and vertical directions. The G filters, which most greatly contributes to obtainment of luminance information, are disposed in every line extending in the horizontal direction, the vertical direction, and slanting directions. Both of the R filters and the B filters are disposed in every line extending in the slanting directions. The number of the G filters is larger than that of the R filters or the B filters.

8 Claims, 7 Drawing Sheets

(56) References Cited

U.S. PATENT DOCUMENTS

| | | | |
|---|---|---|---|
| 6,882,364 B1* | 4/2005 | Inuiya et al. | 348/252 |
| 6,995,796 B2 | 2/2006 | Taubman | |
| 7,019,774 B2* | 3/2006 | Kuno et al. | 348/219.1 |
| 7,110,031 B2* | 9/2006 | Kondo et al. | 348/315 |
| 7,146,042 B2 | 12/2006 | Chen | |
| 7,218,348 B2* | 5/2007 | Misawa | 348/275 |
| 7,336,306 B2* | 2/2008 | Oda | 348/272 |
| 7,932,943 B2* | 4/2011 | Tatani | 348/275 |
| 8,102,460 B2* | 1/2012 | Awazu | 348/340 |
| 8,772,892 B2* | 7/2014 | Okigawa | 257/432 |
| 2003/0011693 A1* | 1/2003 | Oda | 348/272 |
| 2009/0200451 A1 | 8/2009 | Conners | |
| 2010/0128152 A1* | 5/2010 | Hayasaka et al. | 348/280 |
| 2010/0238330 A1* | 9/2010 | Hirota | 348/273 |
| 2011/0019041 A1 | 1/2011 | Ishiwata et al. | |
| 2013/0044244 A1* | 2/2013 | Kawai et al. | 348/280 |
| 2013/0181114 A1* | 7/2013 | Egawa | 250/208.1 |
| 2014/0022359 A1* | 1/2014 | Misawa et al. | 348/49 |
| 2014/0084410 A1* | 3/2014 | Okigawa | 257/447 |

FOREIGN PATENT DOCUMENTS

| | | |
|---|---|---|
| JP | 8-23543 A | 1/1996 |
| JP | 2007-127746 A | 5/2007 |
| JP | 2011-250325 A | 12/2011 |
| WO | WO 2011/132619 A1 | 10/2011 |

OTHER PUBLICATIONS

Written Opinion of the International Searching Authority for PCT/JP2012/083582 mailed on Feb. 5, 2013.

International Preliminary Report on Patentability dated Jul. 10, 2014, issued in PCT/JP2012/083582 (Forms PCT/IB/338, PCT/IB/373 and PCT/ISA/237.

Adams, J. et al., "Color Processing in Digital Cameras", IEEE Micro, vol. 18, No. 6, Nov. 1, 1998, pp. 20-30, XP000805931, IEEE CA, US.

Extended European Search Report issued in European Application No. 11859479.5 on Aug. 4, 2014.

Extended European Search Report issued in European Application No. 11859950.5 on Oct. 28, 2014.

Extended European Search Report issued in European Application No. 12804973.1 on Jan. 27, 2015.

K. Hirakawa, et al., "Spatio-Spectral Color Filter Array Design for Optimal Image Recovery", IEEE Transactions on Image Processing, vol. 17, No. 10, Oct. 1, 2008, pp. 1876-1890, XP011234206, IEEE Service Center, Piscataway, NJ, US.

Parulski, K.A. et al., "High-performance Digital Color Video Camera", Journal of Electronic Imaging, vol. 1, No. 1, Jan. 1, 1992, pp. 35-45, XP000323326, SPIE, USA.

Y. Li, et al., "Color Filter Arrays: A Design Methodology", University of London, Department of Computer Science, May 2008, pp. FP-21, XP002730894, Retrieved from the Internet: URL:http://www.eecs.qmuL.ac.ukl_phao/Paperx/RR-08-03.pdf on Oct. 10, 2014, pp. 1-21.

* cited by examiner

SOLID-STATE IMAGING DEVICE

CROSS-REFERENCE TO RELATED APPLICATIONS

This application is a continuation of PCT International Application No. PCT/JP2012/083582 filed on Dec. 26, 2012, which claims priority under 35 U.S.C §119(a) to Japanese Patent Application No. 2011-285902 filed on Dec. 27, 2011. Each of the above applications is hereby expressly incorporated by reference, in its entirety, into the present application.

BACKGROUND OF THE INVENTION

1. Field of the Invention

The present invention relates to a single-panel type solid-state imaging device for taking a stereoscopic image.

2. Description Related to the Prior Art

In a single-panel type solid-state imaging device, a color filter array is disposed on a substrate that is formed with a two-dimensional array of photoelectric conversion elements (photodiodes). The color filter array has a plurality of color filters patterned in a mosaic, and each photoelectric conversion element is opposed to the color filter of a specific color. Each pixel, which includes the photoelectric conversion element and the color filter of the specific color, outputs a signal of the specific color corresponding to the color of the color filter, without including signals of the other colors. Accordingly, in order to obtain a multiple-channel image for use in display, it is necessary to perform processing (de-mosaic processing) for obtaining the missing color signals by interpolation from pixels in close vicinity.

In this case, the reproducibility of luminance and color by a high-frequency signal contained in object light becomes a problem. More specifically, a fold-back (aliasing) occurs in the high-frequency signal beyond a reproducible range of each color due to a color pattern of the color filter array, and deteriorates the reproducibility of luminance and color.

A primary-color Bayer pattern is widely used as the color pattern of the color filter array of the single-plate type solid-state imaging device. In the primary-color Bayer pattern, green (G) filters are disposed in a checkered pattern, and red (R) filters and blue (B) filters are evenly disposed in the rest. According to the primary-color Bayer pattern, since the G filters greatly contribute to a luminance signal, the reproducibility of luminance is low in a slanting direction and resolution is low in the slanting direction. In each line extending in a vertical or horizontal direction, only the R filters or only the G filters are disposed in addition to the G filters. Thus, the reproducibility of color is low and may cause a false color.

For this reason, in the single-plate type solid-state imaging device, an optical low-pass filter is disposed on a light entry side of the solid-state imaging device to cut the high-frequency signal from the object light. However, the use of the optical low-pass filter degrades the resolution, and therefore improvement in the color pattern of the color filter array is attempted.

For example, U.S. Pat. No. 6,995,796 proposes a color pattern in which a horizontal array of the R, G, and B filters arranged in a predetermined order is set as a unit and the units are arranged out of phase in a zigzag pattern in the vertical direction, so that every color is present in each and every line extending in any direction (each and every straight line in the horizontal, vertical and slanting directions) in the color filter array.

Also, Japanese Patent Laid-Open Publication No. 08-023543 proposes a color patter in which the R filters and the B filters are disposed in every three pixels in the horizontal and vertical directions and the G filters are disposed therebetween.

According to the color pattern of the U.S. Pat. No. 6,995, 796, the presence of every color in each line extending in any direction prevents the occurrence of the false color. However, this color pattern is ineffective at improving the resolution, because this color pattern has the same number of R filters, G filters, and B filters and has a fewer number of G filters than the primary-color Bayer pattern has.

On the contrary, the color pattern of the Japanese Patent Laid-Open Publication No. 08-023543 is effective at improving the resolution because the ratio of the number of the G filters to the number of the R or B filters is higher than that in the case of the primary-color Bayer pattern. However, this color pattern has lines having only the G filters in the horizontal or vertical direction, and hence is ineffective at preventing the false color.

Accordingly, the applicant proposes, in Japanese Patent Application No. 2011-162415, a solid-state imaging device having a color filter array having a color pattern in which the G filters are disposed in each and every line extending in any direction and the R and B filters are disposed in each and every line extending in the horizontal and vertical directions. This color pattern is made by repeatedly disposing a fundamental array pattern of, for example, 6×6 pixels in the horizontal direction and the vertical direction. In the fundamental array pattern, the number of the G filters is more than that of the R or B filters.

Also, there is known a solid-state imaging device in which a pair of pixels (hereinafter called phase difference pixels) that has selectivity in a light entry angle in the horizontal (or vertical) direction is provided in a conventional pixel array having no selectivity in the light entry angle, in order to obtain information about phase difference (parallax) based on pixel values of the phase difference pixels. The information about the phase difference obtained by the phase difference pixels is used in AF processing of a so-called phase difference method, for example.

Furthermore, in recent years, there is proposed a digital camera in which the phase difference pixels are substituted for all pixels so as to obtain a stereoscopic image by using one solid-state imaging device.

In the case of obtaining the stereoscopic image by using the one solid-state imaging device in which the phase difference pixels are substituted for all pixels, right phase difference pixels for selectively receiving light incident from a right side obtain a right-eye image, and left phase difference pixels for selectively receiving light incident from a left side obtain a left-eye image. Thus, it is required to substitute the right phase difference pixels for half of all the pixels, and the left phase difference pixels for the other half. Thus, each of the right-eye image and the left-eye image has low resolution, as compared with an image obtained by a solid-state imaging device in which every pixel is composed of a normal pixel, because the pixel number of the right-eye or the left-eye image is reduced in half. For example, alternately disposing rows of a right phase difference image and rows of a left phase difference image results in reduction of resolution in half in its horizontal direction.

The pixel number of each of the right-eye image and the left-eye image can be interpolated. However, since the original pixel number is low, the interpolation easily causes the occurrence of the false color.

SUMMARY OF THE INVENTION

An object of the present invention is to provide a single-plate type solid-state imaging device that can capture a stereoscopic image of high resolution with preventing the occurrence of a false color.

To achieve the above and other objects, a solid-state imaging device according to the present invention includes a semiconductor substrate having a light receiving area, and a color filter array. The light receiving area has pixel pairs arranged in two dimensions in a horizontal direction and a vertical direction and arranged out of phase by one pixel with respect to a row of the pixel pairs extending along the horizontal direction. Each pixel pair includes two pixels adjoining in the horizontal direction for outputting pixel values in accordance with parallax between the pixels. The color filter array has N types of color filters having different spectral transmittance properties arranged in accordance with the pixel pairs. "N" is an integer of 3 or more. The color filter array includes a fundamental array pattern repeatedly arranged in the horizontal direction and the vertical direction. The fundamental array pattern has a rectangular matrix of the N types of color filters arranged in a predetermined pattern along slanting directions orthogonal to each other. The N types of color filters include a first filter that most greatly contributes to a luminance signal, and second to Nth filters. The first filter is disposed in each line in the horizontal direction, each line in the vertical direction, and each line having three or more of the pixel pairs in the slanting directions. The second to Nth filters are disposed in each line in the slanting directions. The number of the first filters is larger than that of each of the second to Nth filters in the color filter array.

The fundamental array pattern preferably has an isolated portion having the first filter isolated without adjoining to another first filter in the slanting directions, and an adjoining portion having the first filters adjoining each other in the slanting directions. In this case, the first filter is preferably disposed on every pixel pair of the pixel pairs of 2×2 in a rectangular matrix arrangement along the slanting directions.

The fundamental array pattern preferably includes four sub array patterns disposed adjacently in the slanting directions. The sub array pattern is a rectangular matrix arrangement pattern corresponding to the pixel pairs of 3×3 along the slanting directions, and the first filter is disposed on the pixel pairs at the center and the four corners.

Provided that the N types of filters include three types of filters denoted as first to third filters, it is preferable that a first sub array pattern and a second sub array pattern are alternately adjoining in the fundamental array pattern. The first sub array pattern has the first filter disposed on the pixel pair at the center, and the second filter disposed adjacently to the first filter at the center in a first slanting direction being one of the slanting directions, and the third filter disposed adjacently to the first filter at the center in a second slanting direction being the other slanting direction. The second sub array pattern has the first filter disposed on the pixel pair at the center, and the third filter disposed adjacently to the first filter at the center in the first slanting direction, and the second filter disposed adjacently to the first filter at the center in the second slanting direction. It is preferable that the first sub array patterns and the second sub array patterns alternately adjoin in the fundamental array pattern.

The first filter preferably passes green. The second filter preferably passes red. The third filter preferably passes blue.

One microlens is preferably provided for each of the pixel pairs having the color filters.

The first sub array pattern and the second sub array pattern preferably adjoin in parallel with the horizontal direction and the vertical direction. The first sub array pattern and the second sub array pattern may adjoin out of phase by one pixel in the horizontal direction and the vertical direction.

According to the present invention, the pixel pairs, each of which is composed of left and right phase difference pixels, are arrayed in the light receiving area. One color filter is assigned to each pixel pair. The fundamental array pattern is composed of the N types of color filters arranged into a rectangular matrix of a predetermined pattern along the two slanting directions orthogonal to each other. This fundamental array pattern is repeatedly arranged in the horizontal direction and the vertical direction, to compose the color filter array. In the color filter array, the first filter, which most greatly contributes to the luminance signal, is disposed in every line in the horizontal direction, every line in the vertical direction, and every line having the three or more pixel pairs in the slanting directions. The remaining second to Nth filters are disposed in every line in the slanting directions. Since the number of the first filters is larger than the number of each of the second to Nth filters, it is possible to increase resolution with preventing the occurrence of a false color, even if the phase difference pixels are substituted for all the pixels to obtain a stereoscopic image.

BRIEF DESCRIPTION OF DRAWINGS

For more complete understanding of the present invention, and the advantage thereof, reference is now made to the subsequent descriptions taken in conjunction with the accompanying drawings, in which.

DESCRIPTION OF THE PREFERRED EMBODIMENTS

Figure 1:
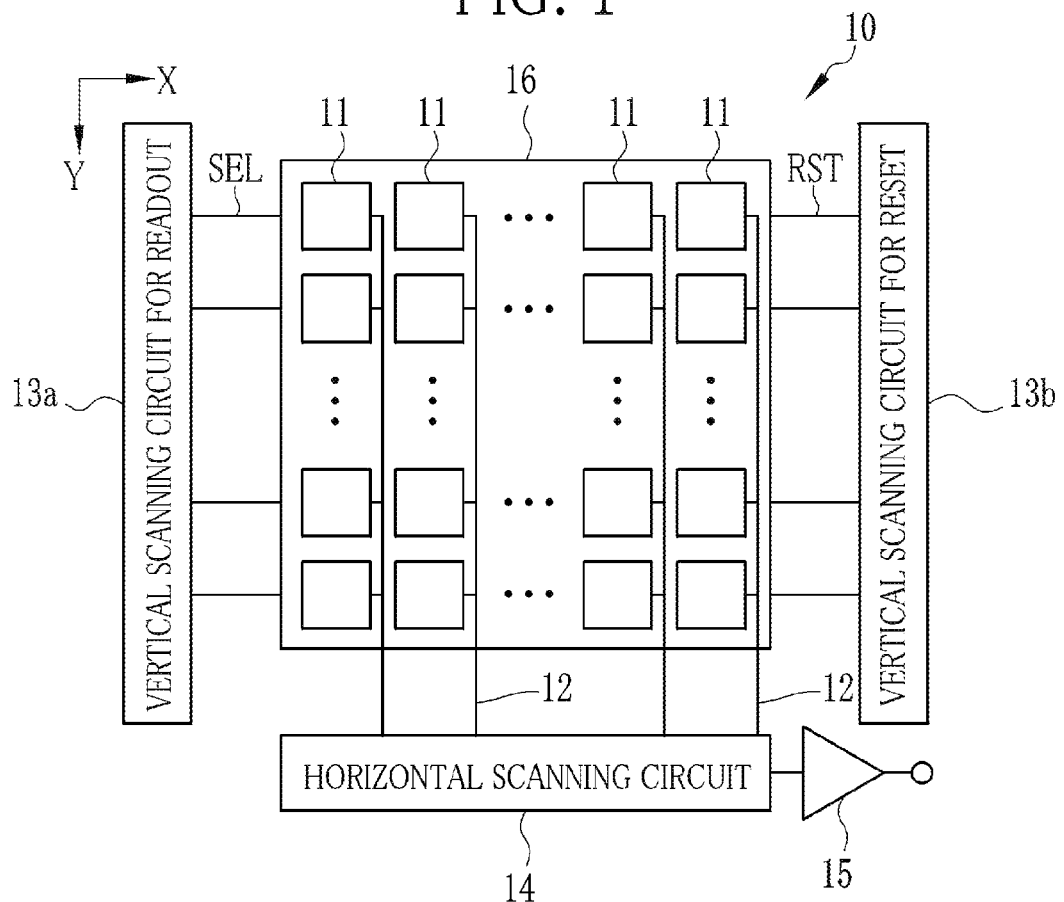
FIG. 1 is an explanatory view showing the structure of a solid-state imaging device.

As shown in FIG. 1, a solid-state imaging device 10, being a CMOS image sensor, is provided with a plurality of pixels 11, vertical signal lines 12, a vertical scanning circuit 13a for readout, a vertical scanning circuit 13b for reset, a horizontal scanning circuit 14, a driving circuit (not shown) for driving each of the vertical scanning circuits 13a and 13b and the horizontal scanning circuit 14, an output circuit 15, and the like.

The pixels 11 are arranged in a semiconductor substrate in two dimensions along a horizontal direction (X direction) and a vertical direction (Y direction). The pixel 11 has a photodiode (photoelectric conversion element) for producing electric charge in accordance with the amount of light received thereby and a plurality of transistors (see FIG. 2). Every pixel 11 is a phase difference pixel that has selectivity in an incident angle in the horizontal direction, depending on the position of an opening formed in a light shielding film contained therein or the like. The pixels are disposed in pairs such that two of the pixels 11 that have symmetric selectivity in the incident angle are adjoining each other. A pixel value of each pixel 11 corresponds to parallax in accordance with the selectivity in the incident angle. A color filter array (see FIG. 5) is provided on a light receiving area 16 having the array of the pixels 11.

The vertical signal line 12, which is provided along each column of the pixels 11 extending in the vertical direction, transmits signal voltage corresponding to the amount of electric charge produced in each pixel 11 to the horizontal scanning circuit 14. The vertical scanning circuit 13a for readout and the vertical scanning circuit 13b for reset select rows of the pixels extending in the horizontal direction one by one sequentially along the vertical direction.

The horizontal scanning circuit 14 sequentially selects the vertical signal lines 12 provided on a column-by-column basis of the pixels 11. In synchronization with the selection operation of the vertical scanning circuit 13a for readout and the vertical scanning circuit 13b for reset, the horizontal scanning circuit 14 sequentially selects the vertical signal lines 12 along the horizontal direction. In readout operation, the signal voltage of each pixel 11 is sequentially transmitted to the output circuit 15 through the horizontal scanning circuit 14. In reset operation, the electric charge of each pixel 11 is abandoned without being taken to the vertical signal line 12 as the signal voltage. The output circuit 15 applies various types of signal processing to the signal voltage transmitted through the horizontal scanning circuit 14.

Figure 2:
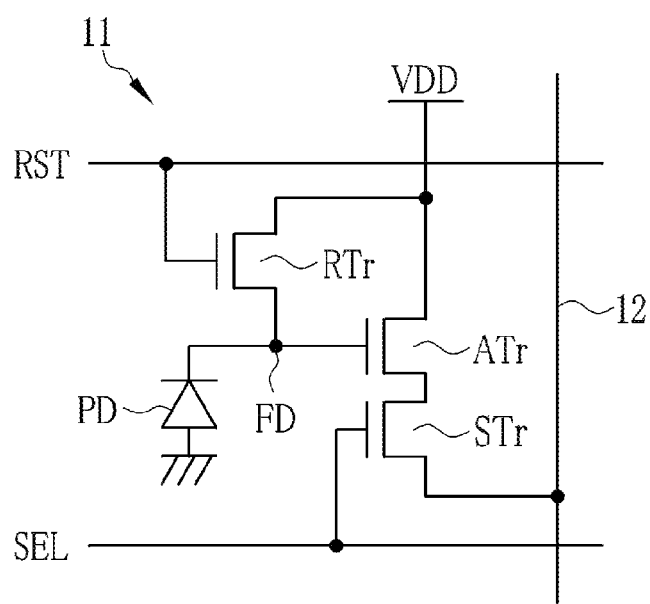
FIG. 2 is a schematic circuit diagram of a pixel.

As shown in FIG. 2, each pixel 11 includes a photodiode PD, a reset transistor RTr, an amplifying transistor ATr, and a selection transistor STr. Each of these transistors is, for example, an n-type MOS transistor.

Each row of the pixels 11 is provided with two driving lines, i.e. a reset line RST and a selection line SEL, and every pixel 11 belonging to the same row is connected to the common reset line RST and the common selection line SEL. An end of the selection line SEL is connected to the vertical scanning circuit 13a for readout. An end of the reset line RST is connected to the vertical scanning circuit 13b for reset. The vertical scanning circuit 13a for readout sequentially actuates the selection lines SEL to carry out the readout operation on a row-by-row basis. The vertical scanning circuit 13b for reset sequentially actuates the reset lines RST to carry out the reset operation on a row-by-row basis.

The photodiode PD performs photoelectric conversion of light received thereby, and produces electric charge by an amount in accordance with the amount of the received light. An anode of the photodiode PD is connected to a ground, and a cathode of the photodiode PD is connected to a gate electrode of the amplifying transistor ATr. A connecting portion between the cathode of the photodiode PD and the gate electrode of the amplifying transistor ATr composes a floating diffusion FD for accumulating the electric charge produced by the photodiode PD.

A source electrode of the reset transistor RTr is connected to the floating diffusion FD. A power supply voltage VDD is applied to a drain electrode of the reset transistor RTr. By applying a reset pulse to a gate electrode of the reset transistor RTr through the reset line RST, the reset transistor RTr is turned on. Upon turning on the reset transistor RTr, the power supply voltage VDD is applied to the floating diffusion FD, and hence the accumulated electric charge is abandoned.

The gate electrode of the amplifying transistor ATr is connected to the floating diffusion FD. The power supply voltage VDD is applied to a drain electrode of the amplifying transistor ATr. Thus, the amplifying transistor ATr outputs signal voltage from its source electrode in accordance with the electric charge accumulated in the floating diffusion FD.

A drain electrode of the selection transistor STr is connected to the source electrode of the amplifying transistor ATr. A source electrode of the selection transistor STr is connected to the vertical signal line 12. By applying a selection pulse to a gate of the selection transistor STr through the selection line SEL, the selection transistor STr is turned on. Upon turning on the selection transistor STr, the signal voltage outputted from the source electrode of the amplifying transistor ATr is transmitted to the vertical signal line 12.

Note that, the pixel 11 may be composed of four transistors having another transfer transistor between the photodiode PD and the floating diffusion FD, or the like.

Figure 3:
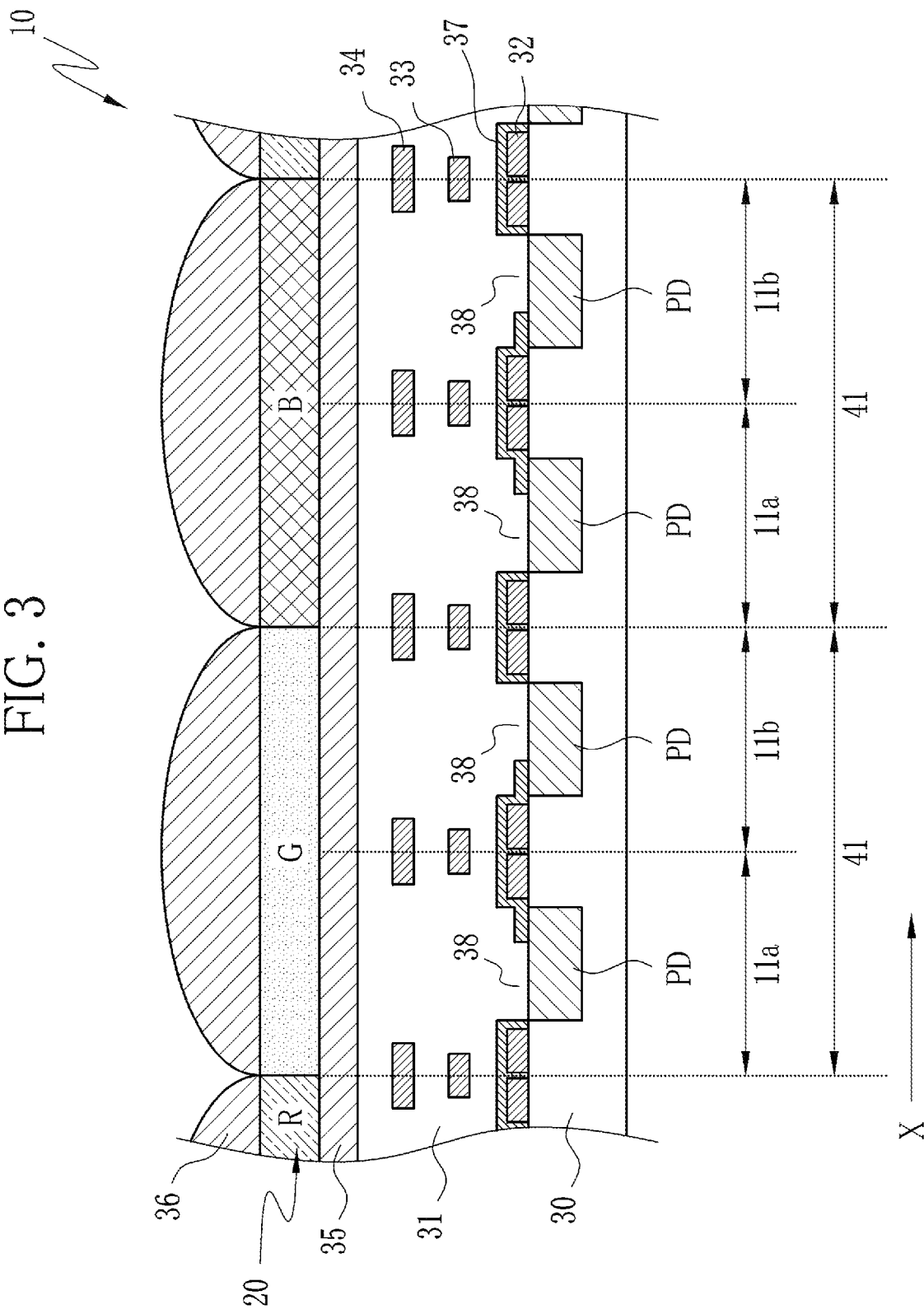
FIG. 3 is a cross sectional view of the solid-state imaging device taken along a horizontal direction.

As shown in FIG. 3, the photodiode PD is formed in a surface layer of a p-type semiconductor substrate 30 as a n-type semiconductor region. The photodiode PD performs photoelectric conversion at a p-n junction between the p-type semiconductor substrate 30 and the n-type semiconductor region, to produce signal charge in accordance with the amount of light incident thereon. A wiring layer 31 is formed on the surface of the p-type semiconductor substrate 30. The wiring layer 31 has electrodes 32 made of amorphous silicon or the like, and wiring 33 and 34 made of aluminum or the like. The electrodes 32 and the wiring 33 and 34 compose the electrodes and the wiring of the transistors described above.

A flattening film 35 made of silicon dioxide ($SiO_2$) or the like is formed on the wiring layer 31. The above-mentioned color filter array 20 is provided on the flattening film 35.

On the color filter array 20, microlenses 36 are formed. The microlenses 36 are made of $SiO_2$, a transparent resin material, or the like. The microlens 36 is provided on a filter of each color of the color filter array 20 on a one-by-one basis. In other words, the microlenses 36 lies astride the two pixels 11 adjoining in the horizontal direction, and gathers light into each of the photodiodes PD of the two pixels 11. To distinguish the two pixels, reference numerals 11a and 11b are assigned to the two pixels. Out of light ejected from the microlenses 36, only a specific color component of light that has passed through the color filter of the color filter array 20 provided immediately below the microlens 36 is incident upon the photodiodes PD of the pixels 11a and 11b.

On the electrodes 32, a light shielding film 37 is provided to limit the positions of openings of the photodiodes PD through a not-shown insulating film. The positions of openings 38, which are defined by the light shielding film 37, are out of phase oppositely in the horizontal direction between the adjoining two pixels 11a and 11b. Owing to the positions of the openings 38 and the disposition of the microlens 36 lying astride the two pixels 11a and 11b, the pixels 11a and 11b have selectivity in the incident angle of light in opposed directions to each other, i.e. left and right. Thus, a pair of the pixels 11a and 11b adjoining in the horizontal direction is a pair of phase difference pixels for obtaining information about the parallax. The pixels 11a and 11b are hereinafter referred to as a pixel pair 41. Out of the two pixels composing the pixel pair 41, a left pixel refers to the pixel 11a on the left side, and a right pixel refers to the pixel 11b on the right side.

Figure 4:
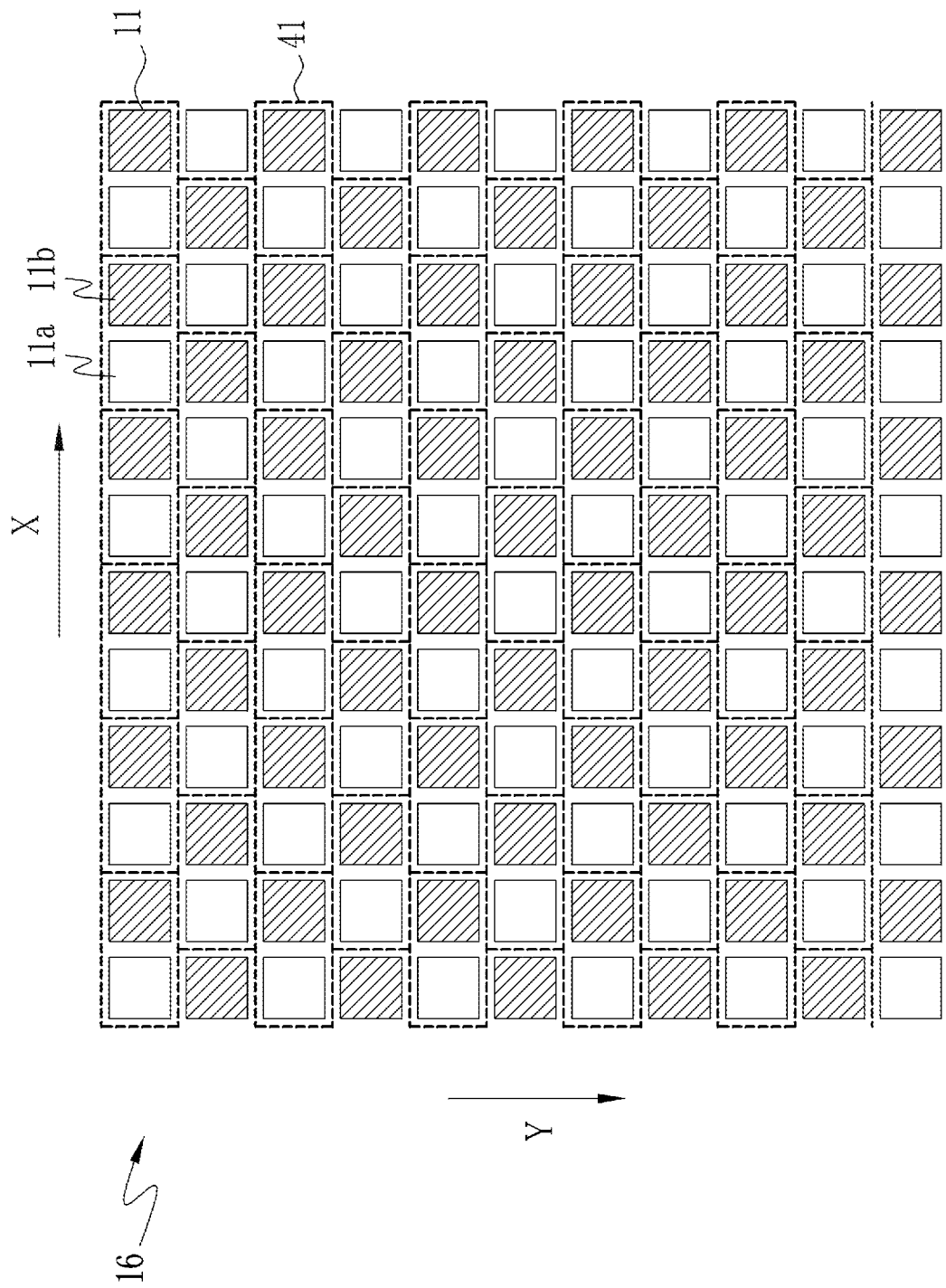
FIG. 4 is a plan view of an array of pixel pairs.

As shown in FIG. 4, the left pixels 11a (not-hatched) and the right pixels 11b (hatched) are alternately arranged in the horizontal direction and the vertical direction. Thus, the pixel pairs 41, each of which is constituted of a pair of the left pixel 11a and the right pixel 11b adjoining in the horizontal direction as shown by enclosure with a broken line, are arranged along the horizontal direction and the vertical direction so as to be out of phase by one-half pitch (one pixel) between the adjoining rows.

Figure 5:
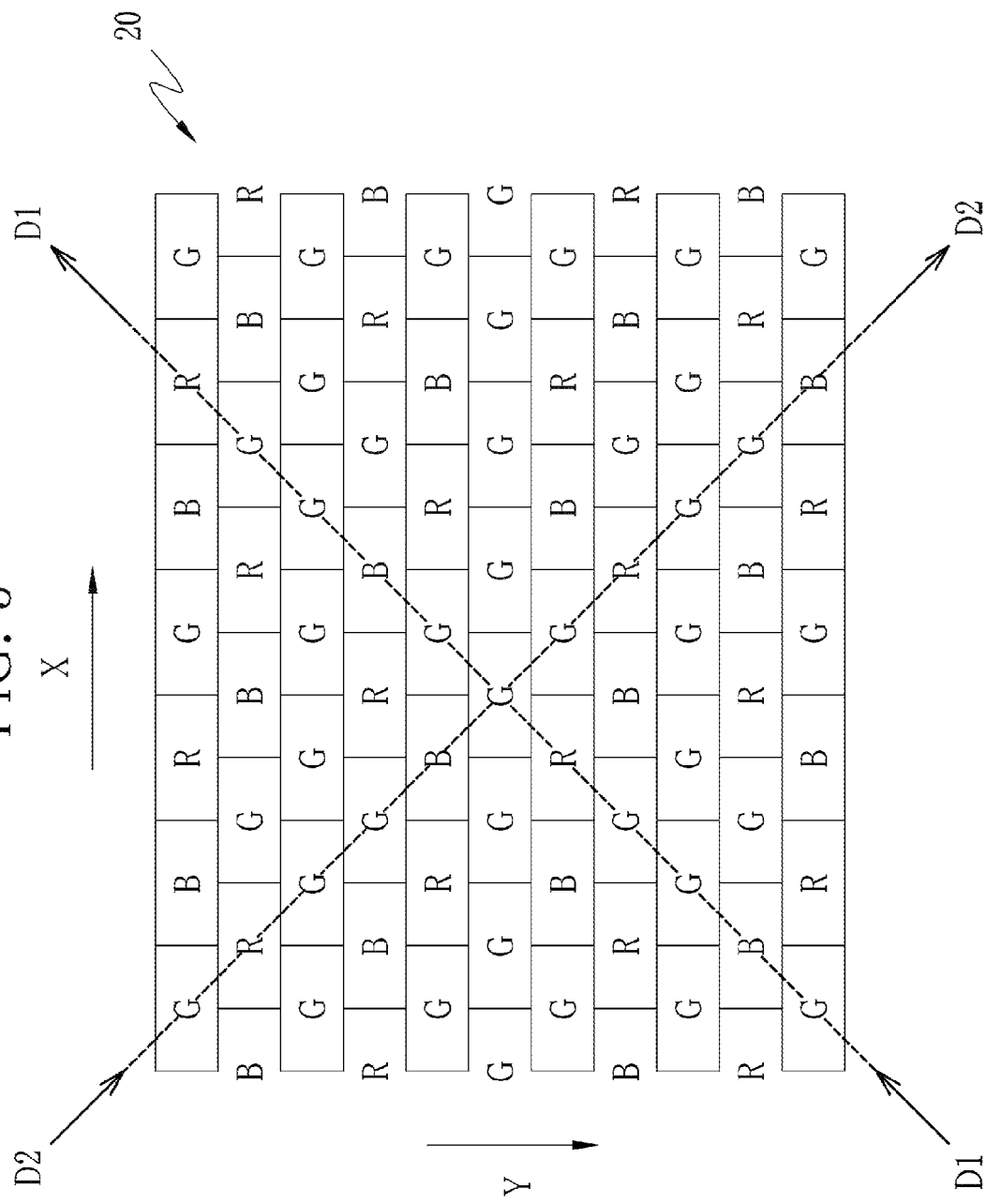
FIG. 5 is a plan view showing a pattern of a color filter array.

As shown in FIG. 5, the color filter array 20 is in the shape of a rectangle in a plane whose sides are along the horizontal direction and the vertical direction. The color filter array 20 is provided with a plurality of types of color filters (filter segments), for example, G filters, R filters, and B filters, having different spectral transmittance properties from each other. In the drawing, "G", "R", and "B" represent the G filter, the R filter, and the B filter, respectively. Each filter has such a spectral transmittance property as to pass a corresponding color. Any one of the G filter, the R filter, and the B filter covers the one pixel pair 41. "D1" and "D2" represent slanting directions inclined by 45 degrees with respect to the horizontal direction and the vertical direction.

Figure 6:
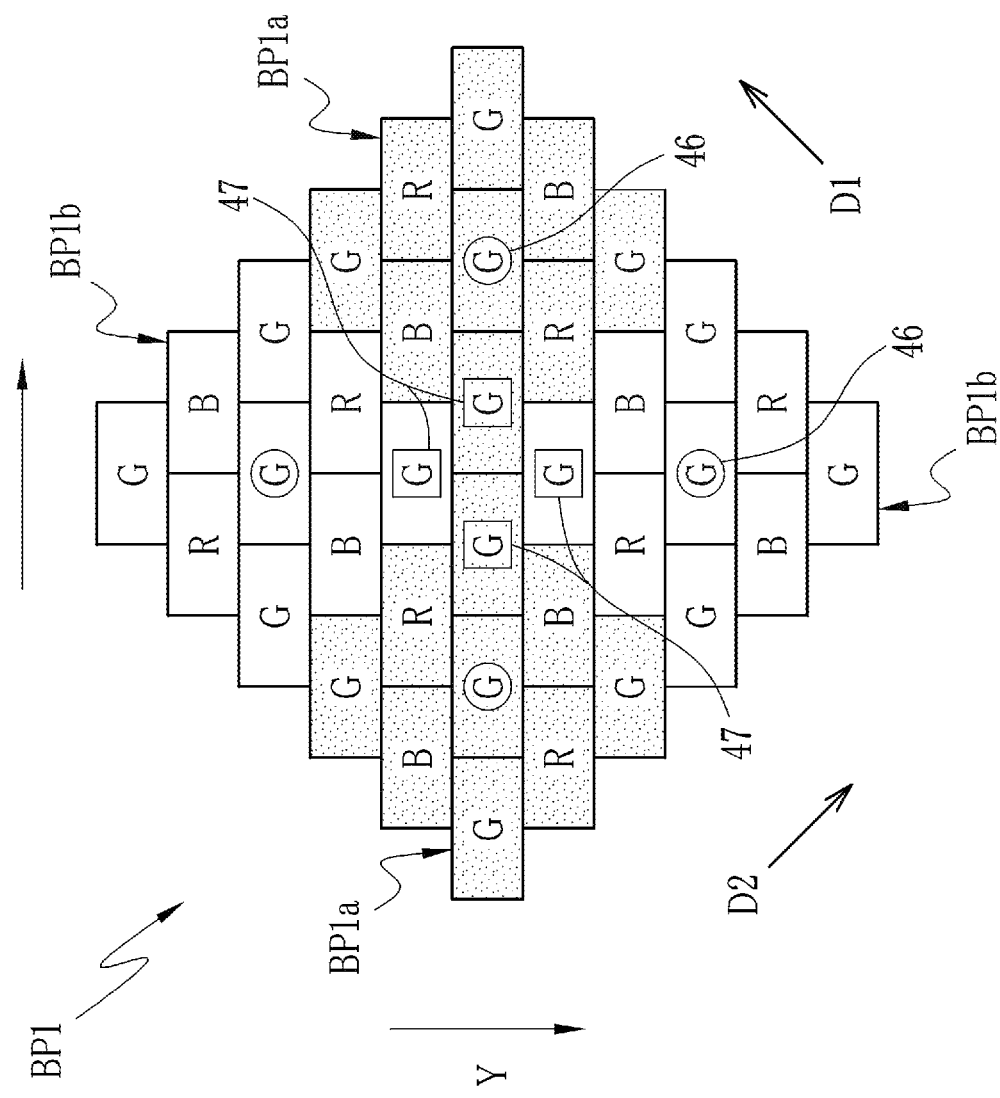
FIG. 6 is an explanatory view of a fundamental array pattern.

To compose a color pattern of the color filter array 20, fundamental array patterns BP1 are arranged along the slanting directions D1 and D2. As shown in FIG. 6, the fundamental array pattern BP1 is composed of the pixel pairs 41 of 6×6 arranged in the slanting directions D1 and D2.

The fundamental array pattern BP1 is composed of first sub array patterns BP1a and second sub array patterns BP1b arranged adjacently in the slanting directions D1 and D2. Each of the first sub array pattern BP1a and the second sub array pattern BP1b corresponds to the pixel pairs 41 of 3×3 arranged in the slanting directions D1 and D2.

In each of the first sub array pattern BP1a and the second sub array pattern BP1b, the G filters are disposed in the center and the four corners so as to be aligned in two diagonal lines along the horizontal direction and the vertical direction. In the first sub array pattern BP1a, the two R filters are disposed across the center G filter in the slanting direction D1, and the two B filters are disposed across the center G filter in the slanting direction D2. In the second sub array pattern BP1b, on the contrary, the two B filters are disposed across the center G filter in the slanting direction D1, and the two R filters are disposed across the center G filter in the slanting direction D2. In other words, the positional relation between the R filters and the B filters is opposite between the first sub array pattern BP1a and the second sub array pattern BP1b, though the disposition of the G filters is the same.

According to each of the first sub array pattern BP1a and the second sub array pattern BP1b, the ratio in number among the G filters, the R filters, and the B filters is 5:2:2. Therefore, the ratio in number among the G filters, the R filters, and the B filters is 5:2:2 in the fundamental array pattern BP1, and hence the number of the G filters is larger than that of the R filters or the B filters.

In each of the first sub array pattern BP1a and the second sub array pattern BP1b, the center G filter 46 is isolated from the other G filters without being adjoining in the slanting directions. On the other hand, the G filters on the four corners of the first sub array patterns BP1a and the second sub array patterns BP1b form a G filter group 47, which corresponds to the pixel pairs 41 of 2×2 along the slanting directions D1 and D2. The G filter group 47 is in a rectangular matrix arrangement along the slanting directions D1 and D2. The isolated G filters 46 and the G filter groups 47 in the rectangular matrix arrangement are arranged alternately in the horizontal direction and the vertical direction.

According to the above color pattern, the G filters are present in each line of the horizontal direction (X direction), the vertical direction (Y direction) and the slanting directions D1 and D2. In the horizontal direction and the vertical direction, at least two G filters are adjoining. In the center, the four G filters are in the rectangular matrix arrangement. The R filters and the B filters are present in each line of the slanting directions D1 and D2.

In the solid-state imaging device 10 having the above structure, light is incident upon the light receiving area 16 on the side of the microlenses 36. The light incident upon the light receiving area 16 is gathered by the microlenses 36, and passes through the color filter array 20. The light is separated into each color by the color filter array 20, and enters the photodiodes PD of the pixels 11.

The photodiode PD produces the electric charge by the photoelectric conversion. The produced electric charge is accumulated in the floating diffusion FD. In accordance with the accumulated electric charge, the amplifying transistor ATr produces the signal voltage.

Then, the vertical scanning circuit 13a for readout applies voltage sequentially to the selection lines SEL, which are provided in the rows of the pixels 11 on a one-by-one basis, to turn on the selection transistors STr on a row-by-row basis. Thus, the signal voltage is outputted to the vertical signal lines 12 on a row-by-row basis. The horizontal scanning circuit 14 transmits the signal voltage outputted to each vertical signal line 12 by sequentially selecting the vertical signal lines 12. The signal voltage is subjected to the signal processing in the output circuit 15, and outputted to the outside. Note that, upon the completion of the output of the signal voltage of one row, the vertical scanning circuit 13b for reset applies voltage to the reset line RST of the corresponding row to turn on the reset transistors RTs of the corresponding row. Thus, the electric charge accumulated in the floating diffusions FD of the corresponding row is abandoned.

The above operation is repeated on a row-by-row basis, and the signal voltage of one screen is outputted as output data. The output data includes information obtained from both of the left pixels 11a and the right pixels 11b. Therefore, a not-shown signal processing circuit separates data obtained from the left pixels 11a and data obtained from the right pixels 11b, and produces two types of display images, having parallax in left and right for stereoscopy, from each type of data.

The output data composes an image (so-called raw image) that has color information of only the color assigned by each filter of the color filter array 20. Accordingly, the data (hereinafter called left pixel data) obtained from the left pixels 11a and the data (hereinafter called right pixel data) obtained from the right pixels 11b, which are obtained by separation of the output data, has the missing color information too. Thus, in order to obtain a multi-channel image as each of the left and right display images from the left pixel data and the right pixel data, respectively, the not-shown signal processing circuit performs de-mosaic processing for obtaining the missing color information by interpolation from the pixels in close vicinity.

Figure 7:
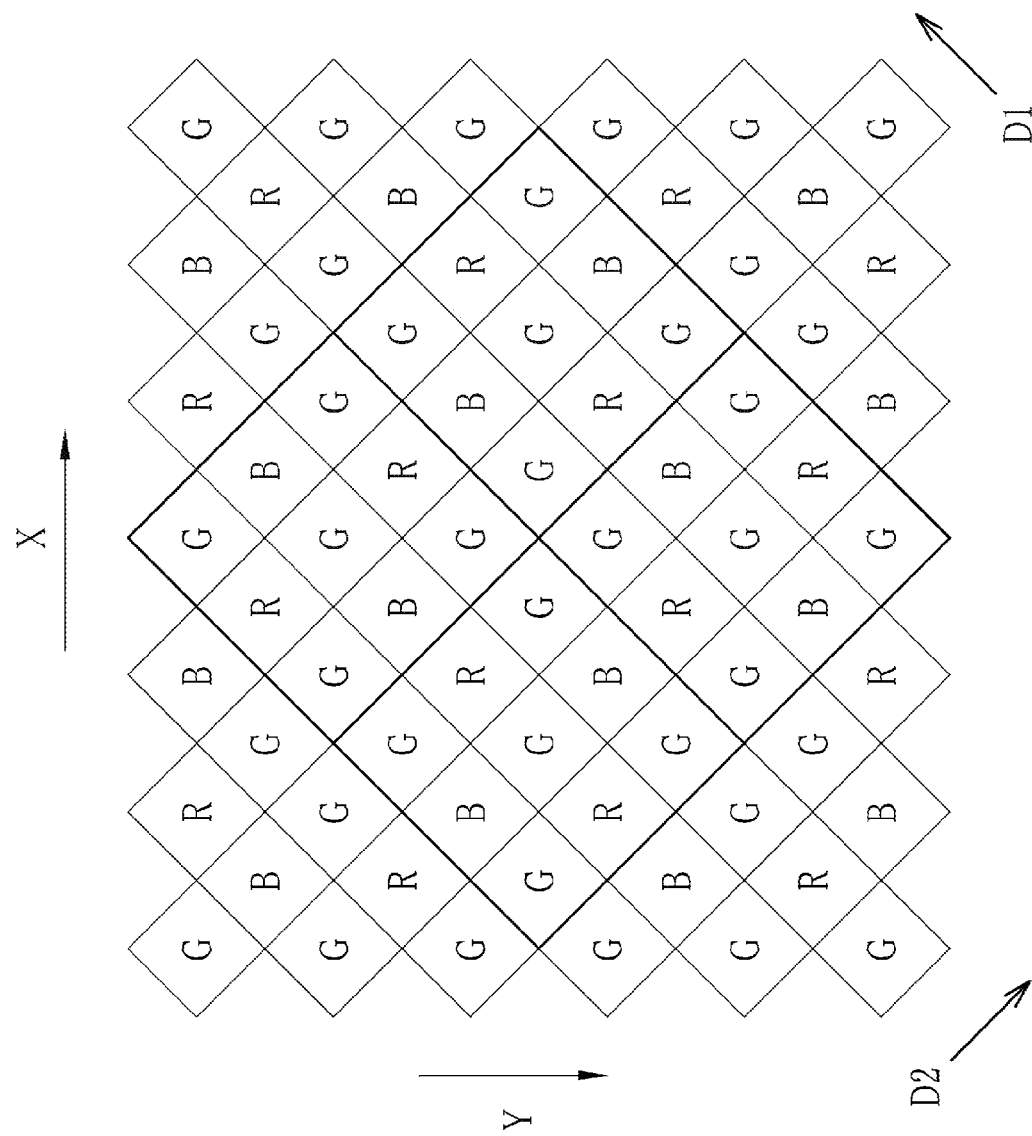
FIG. 7 is an explanatory view of sampling points.

As shown in FIG. 7, sampling points of an object are in so-called honeycomb in the left pixel data and the right pixel data. In producing the display images, data at midpoints between the adjoining sampling points is produced by interpolation to obtain data of points in the rectangular matrix arrangement. In FIG. 7, wide lines represent correspondence with the fundamental array pattern BP1.

Note that, the de-mosaic processing allows obtainment of each color signal of G, R, B at each sampling point. A luminance signal (Y) is calculated by, for example, $Y=0.299 \cdot r + 0.587 \cdot g + 0.114 \cdot b$. In this expression, "r", "g", and "b" represent an R signal, a G signal, and a B signal, respectively. As is apparent from the expression, the G signal is more heavily weighted than the other signals, and most greatly contributes to obtainment of the luminance signal Y.

In the color filter array 20, the fundamental array pattern BP1 is arranged repeatedly in the slanting directions D1 and D2. The G filters, which most greatly contributes to obtainment of the luminance signal, are present in every arbitrary line (straight lines in the horizontal, vertical, and slanting directions), and the number of the G filters is larger than the number of the R filters or the B filters. Therefore, the occurrence of aliasing caused by the de-mosaic processing is restrained, and hence it is possible to obtain luminance information of high resolution with high reproducibility of the luminance information.

According to the color filter array 20, since both of the R filters and the B filters are present in each line in the slanting directions D1 and D2, in addition to the G filters, the occurrence of a false color is prevented in the de-mosaic processing. Therefore, it is possible to realize high resolution without using an optical low-pass filter for cutting a high frequency component from incident light.

The color filter array 20 has the G filter groups 47, each of which is composed of the pixels of 2×2 in the rectangular matrix arrangement. Four pixel values corresponding to the G filter group 47 are extracted from the left pixel data and the right pixel data. Then, an absolute value of difference between the pixel values in the slanting direction D1, an absolute value of difference between the pixel values in the slanting direction D2, and absolute values of difference between the pixel values in the horizontal direction and the vertical direction are calculated. A direction having the lowest absolute value of difference is judged to be a direction having high correlation. This correlation direction is used in the de-mosaic processing.

In the case of extracting sampling points of 5×5 each of which has the first sub array pattern or the second sub array pattern in its middle from the left pixel data and the right pixel data, the 2×2 pixels corresponding to the G filter groups 47 are positioned at four corners. Thus, it is possible to judge the correlation direction, out of the four directions, with high precision by using the pixel values of the G filters at minimum pixel intervals.

Figure 8:
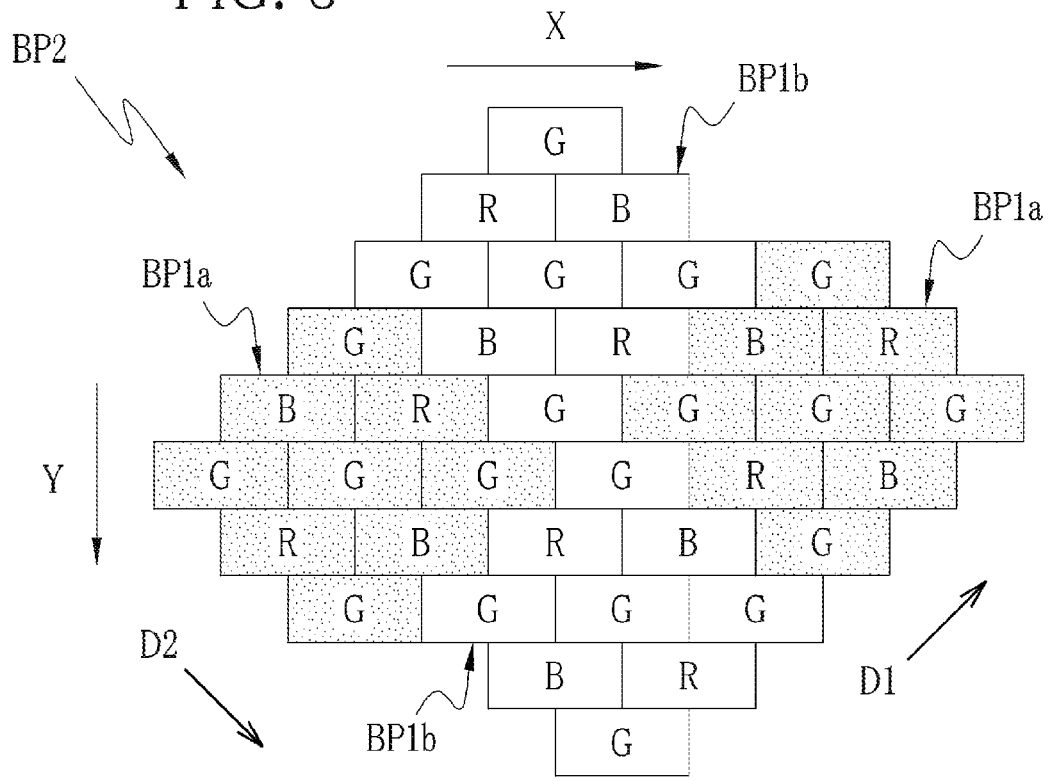
FIG. 8 is a plan view of another fundamental array pattern.

Note that, in the array pattern of the color filter array 20, the fundamental array pattern BP1, having the first sub array patterns BP1a and the second sub array patterns BP1b neatly arranged in phase in the horizontal direction and the vertical direction, is arranged in the slanting directions D1 and D2. However, as shown in FIG. 8, a fundamental array pattern BP2, which has the first sub array patterns BP1a and the second sub array patterns BP1b arranged out of phase by one pixel in the horizontal direction and the vertical direction, may be used instead. Using a color filter array having the fundamental array pattern BP2 arranged in the slanting directions D1 and D2 can achieve the same effect as the above embodiment.

Note that, the pixels 11 are in the rectangular matrix arrangement along the horizontal direction and the vertical direction in the above embodiments, but may be in a honeycomb arrangement in which the array of the pixels 11 are turned by 45 degrees. In this case, the color pattern of the color filter array 20 may be also turned by 45 degrees.

Figure 9:
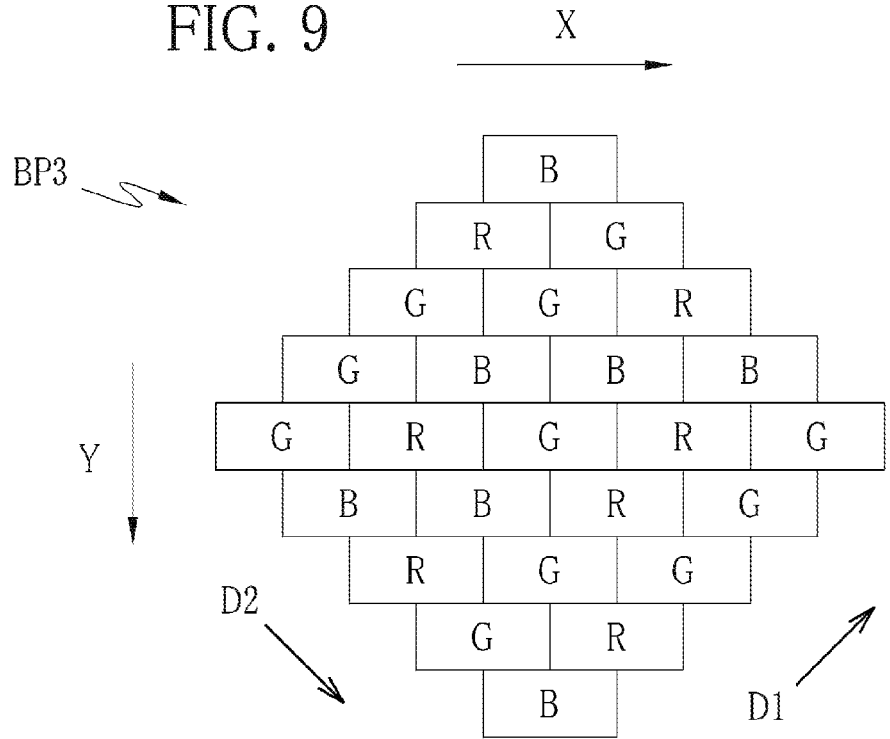
FIG. 9 is a plan view of further another fundamental array pattern.

Note that, the color pattern of the color filter array 20 may be composed of, for example, a fundamental array pattern BP3 of 5×5 pixels, as shown in FIG. 9, arranged in the horizontal and vertical directions. The color pattern of the color filter array is arbitrary changeable as long as the color pattern is composed of a fundamental array pattern repeatedly arranged in the horizontal and vertical directions, and the G filters, which most greatly contributes to obtainment of the luminance information, are present in every arbitrary line (straight lines in the horizontal, vertical, and slanting directions), and the number of the G filters is larger than that of the R filters or the B filters, and both of the R filters and the B filters, in addition to the G filters, are present in each line in the slanting directions D1 and D2.

The color pattern of the color filter array may be composed of four or more colors, instead of the three colors of G, R, and B. For example, four colors of G, R, B, and emerald (E) may be used. The color pattern of the color filter array may be composed of complementary colors of cyan (C), magenta (M), and yellow (Y). In this case, the complementary colors of four colors, i.e. C, M, Y, and green (G) may be used.

The CMOS type solid-state imaging device is used in the above embodiments, but the present invention is applicable to a CCD type solid-state imaging device. Also, the present invention is applicable to both of a front surface irradiation type image sensor in which light is incident upon photodiodes from the side of a front surface having a wiring layer for controlling the photodiodes and a back surface irradiation type image sensor in which light is incident upon the photodiodes from the side of a back surface without passing through the wiring layer.

Although the present invention has been fully described by the way of the preferred embodiment thereof with reference to the accompanying drawings, various changes and modifications will be apparent to those having skill in this field. Therefore, unless otherwise these changes and modifications depart from the scope of the present invention, they should be construed as included therein.

What is claimed is:

1. A solid-state imaging device comprising:
a semiconductor substrate having a light receiving area, said light receiving area having pixel pairs arranged in two dimensions in a horizontal direction and a vertical direction and arranged out of phase by one pixel with respect to a row of said pixel pairs extending along said horizontal direction, each of said pixel pairs including two pixels adjoining in said horizontal direction for outputting pixel values in accordance with parallax between said pixels; and
a color filter array having N types of color filters having different spectral transmittance properties arranged in accordance with said pixel pairs, said N being an integer of 3 or more, said color filter array including a fundamental array pattern repeatedly arranged in said horizontal direction and said vertical direction, said fundamental array pattern having a rectangular matrix of said N types of color filters arranged in a predetermined pattern along slanting directions orthogonal to each other, said N types of color filters including a first filter that most greatly contributes to a luminance signal and second to Nth filters, said first filter being disposed in each line in said horizontal direction, each line in said vertical direction, and each line having three or more of said pixel pairs in said slanting directions, said second to Nth filters being disposed in each line in said slanting directions, a number of said first filters being larger than a number of each of said second to Nth filters in said color filter array, and
wherein said fundamental array pattern has an isolated portion having said first filter isolated without adjoining to another of said first filter in said slanting directions, and an adjoining portion having said first filters adjoining each other in said slanting directions.

2. The solid-state imaging device according to claim 1, wherein in said adjoining portion, said first filter is disposed on every pixel pair of said pixel pairs of 2×2 in a rectangular matrix arrangement along said slanting directions.

3. The solid-state imaging device according to claim 2, wherein
said fundamental array pattern includes four sub array patterns disposed adjacently in said slanting directions; and
said sub array pattern is a rectangular matrix arrangement pattern corresponding to said pixel pairs of 3×3 along said slanting directions, and said first filter is disposed on said pixel pairs at a center and four corners.

4. The solid-state imaging device according to claim 3, wherein
said N types of filters include three types of filters denoted as first to third filters;
said sub array pattern includes a first sub array pattern and a second sub array pattern, and said first sub array pattern has said first filter disposed on said pixel pair at a center, and said second filter disposed adjacently to said first filter at the center in a first slanting direction being one of said slanting directions, and said third filter disposed adjacently to said first filter at the center in a second slanting direction being the other of said slanting directions, said second sub array pattern has said first filter disposed on said pixel pair at the center, and said third filter disposed adjacently to said first filter at the center in said first slanting direction, and said second filter disposed adjacently to said first filter at the center in said second slanting direction; and
said first sub array patterns and said second sub array patterns alternately adjoin in said fundamental array pattern.

5. The solid-state imaging device according to claim 4, wherein said first filter passes green, said second filter passes red, and said third filter passes blue.

6. The solid-state imaging device according to claim 5, wherein said first sub array pattern and said second sub array pattern adjoin out of phase by one pixel in said horizontal direction and said vertical direction.

7. The solid-state imaging device according to claim 4, wherein said first sub array pattern and said second sub array pattern adjoin in parallel with said horizontal direction and said vertical direction.

8. The solid-state imaging device according to claim 1, wherein one microlens is provided for each of said pixel pairs having said color filters.

* * * * *